United States Patent

[11] 3,594,594

[72] Inventor Peter S. Castro
Los Altos, Calif.
[21] Appl. No. 783,785
[22] Filed Dec. 12, 1968
[45] Patented July 20, 1971
[73] Assignee Lockheed Aircraft Corporation
Burbanks, Calif.

[54] TUNNEL DIODE FREQUENCY-TRANSFORMING CIRCUIT
1 Claim, 4 Drawing Figs.

[52] U.S. Cl. .......... 307/322, 307/233, 307/295, 328/16
[51] Int. Cl. .......... H03b 19/00, H03k 3/31
[50] Field of Search .......... 307/225, 231, 295, 322, 295, 233; 328/16; 331/107

[56] References Cited

UNITED STATES PATENTS

| | | | |
|---|---|---|---|
| 2,978,576 | 4/1961 | Watters | 307/322 |
| 3,117,281 | 1/1964 | Rhodes | 331/107 |
| 3,181,070 | 4/1965 | Robuck | 307/225 |
| 3,435,374 | 3/1969 | Whitten | 307/322 |

OTHER REFERENCES

" Subharmonic Oscillator" by Johnson & French, IBM TECHNICAL DISCLOSURE BULLETIN, Vol. 3, No. 6 November 1960, page 35, Nov. 1960.

LOW NOISE TUNNEL-DIODE DOWN CONVERTER HAVING CONVERSION GAIN by Chang et al., "Proceeding of the IRE," May 1960. pages 854— 858. (copy in 307/322)

*Primary Examiner*—Donald D. Forrer
*Assistant Examiner*—Harold A. Dixon
*Attorneys*—Paul F. Morgan and George C. Sullivan

ABSTRACT: Frequency division of an RF input signal is provided by a circuit having a tunnel diode and resonant circuitry tuned to the input frequency and also tuned to a selected output frequency, which is a ratio or subharmonic of the input frequency. The tunnel diode is biased so that no oscillation and no output signal occurs in the circuit in the absence of the input signal. When an input signal is applied selected subharmonic signals extend into the negative resistance region of the tunnel diode and are sustained.

INVENTOR.
PETER S. CASTRO
BY George C. Sullivan
Agent
Paul F. Morgan
Attorney

TUNNEL DIODE FREQUENCY-TRANSFORMING CIRCUIT

The present invention relates to a frequency-transforming circuit and more particularly to a circuit utilizing a biased tunnel diode and resonant circuits to effect accurate and stable frequency transformation without local oscillator circuitry.

Frequency divider circuits in the prior art are exemplified by U.S. Pat. No. 2,738,423 to G. C. Sziklai, March 13, 1956. Further, tunnel diodes have been utilized in prior frequency divider circuits, e.g. U.S. Pat. No. 3,076,944 to R. L. Watters, Feb. 5, 1963 and U.S. Pat. No. 3,207,914 to Shigeaki Mabuchi, Sept. 21, 1965. These patents may be considered as a part of the present disclosure in their descriptions of operating theories, etc., however it will be appreciated from the description herein that the circuit of the present invention is clearly distinct in structure, operation and advantages.

The present invention provides a simple but accurate and reliable frequency division circuit particularly suitable for high frequencies. Microwave frequency division may be accomplished. The only limitations in its operation are those of the single tunnel diode utilized. The output signal is a clean sinusoidal waveform of the desired output frequency with negligible other signal content. There is no output signal present until the input signal is applied, and the output signal is directly derived from and firmly locked to the input frequency. There are no local oscillators or other sources of frequency instabilities.

Further objects, features and advantages of the invention pertain to the particular arrangement and structure whereby the above-mentioned aspects of the invention are attained. The invention will be better understood by reference to the following description and to the drawings forming a part thereof, wherein.

Figures 1, 2, 3, 4:
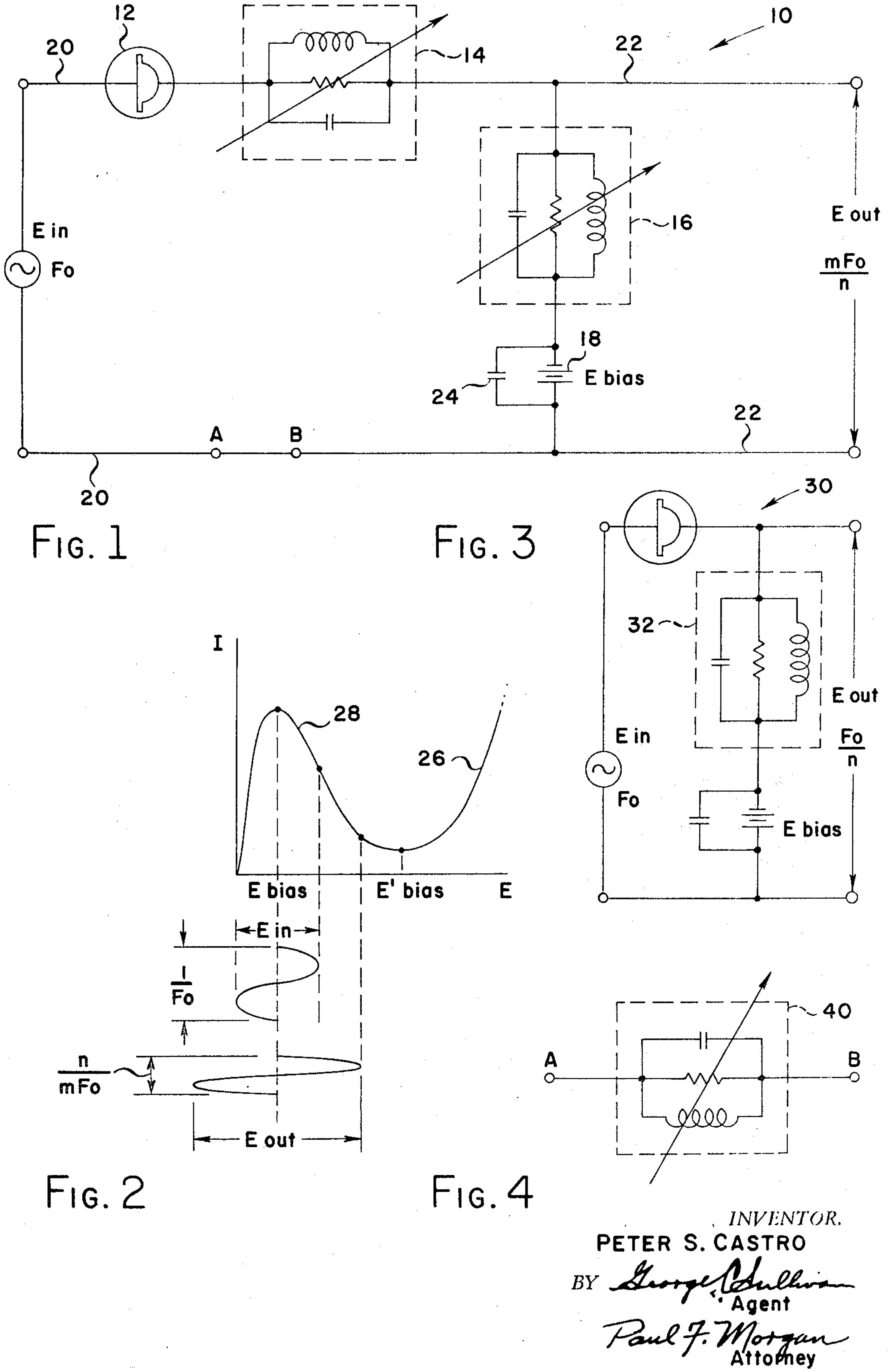
FIG. 1 is a schematic diagram of an exemplary frequency-transforming circuit in accordance with the present invention.
FIG. 2 illustrates the electrical characteristics of the circuit of FIG. 1.
FIG. 3 is a schematic diagram of another embodiment of the circuit of FIG. 1.
FIG. 4 is a schematic diagram of a further embodiment of the circuit of FIG. 1.

Referring first to FIGS. 1 and 2, there is shown an exemplary frequency divider circuit 10 in accordance with the present invention. The frequency divider circuit 10 contains only a tunnel diode 12, a first resonant circuit 14, a second resonant circuit 16, and a bias voltage supply 18 for the tunnel diode 12. The input RF signal (Ein at to is applied to input leads 20 and the output signal (Eout at *m*Fo/*n*) appears at output leads 22. The circuit 10 is particularly intended as a frequency divider for obtaining any desired ratio of a high frequency signal.

Considering the circuit 10 in greater detail it may be seen that the tunnel diode 12, the first resonant circuit 14 and the second resonant circuit 16 are all connected in a series circuit. The input leads 20 are connected across this series circuit, thereby applying the input signal to all of these components. The output leads 22 are connected across only the second resonant circuit 16. (The bypass capacitor 24 does not present any RF impedance). The resonant frequency of the second resonant circuit 16 is preset to the desired output frequency, which is a selected ratio of integers (*m*/*n*) of the input frequency Fo. For frequency division of course *n* is greater than *m*. The resonant frequency of the first resonant circuit 14 is preset to a frequency for which the sum or difference of the first and second resonant frequencies equals the input signal frequency Fo.

It may be seen from FIG. 1 that the first resonant circuit 14 and second resonant circuit 16 are both parallel tuned. While lumped L-C components appear in this schematic representation it will be obvious that distributed elements such as transmission line segments or tuned cavities would preferably be utilized to provide these resonant circuits for high frequencies. The positive resistances shown associated with the L-C components of the tuned circuits 14 and 16 illustrate their inherent resistances, which should be low, i.e. high Q tank circuits are desirable. The second resonant circuit 16, being parallel tuned, only sustains a voltage across itself at its tuned frequency, which is the selected output frequency of the circuit 10. As the output is directly across the resonant circuit 16 there is no need for further filtering or signal treatment of the output signal, and the output signal will be essentially purely sinusoidal.

The resonant frequency of the first resonant circuit 14 is preset is accordance with the desired input and output frequencies. It provides a first resonant frequency which, when beat against the second resonant frequency of the second resonant circuit 16, will reproduce the input frequency, i.e. the first resonant frequency plus or minus the second resonant frequency will equal the input frequency.

The circuit 10 will maintain the output frequency stabily locked to the input frequency even if the resonant circuits 14 and 16 drift or otherwise vary somewhat from their selected resonant frequencies.

The tunnel diode 12 may be of any desired type of such semiconductor devices providing nonlinear impedance characteristics and positive and negative resistance regions which is capable of effective operation at the desired frequencies. FIG. 2 illustrates the tunnel diode 12 characteristic curve 26, having a negative resistance region 28. As may be seen from FIG. 1 single tunnel diode 12 is the only active element required in the entire circuit. The tunnel diode 12 amplifies and sustains harmonics created when the input signal is applied to its nonlinear resistance. The nonlinear resistance of the tunnel diode 12 further provides mixing or beating of the two resonant frequencies to which the two resonant circuits are tuned to reproduce and lock to the input frequency. The required amplification of the tunnel diode need not be great and will depend upon the magnitude of the positive circuit resistances. The positive circuit resistances must be cancelled out and overcome by the negative resistance of the tunnel diode in order to sustain signals in the resonant circuits.

The bias voltage supply 18 may be provided by any suitable DC voltage source connected to the tunnel diode 12 so as not to interfere with or impede the RF signals in the circuit 10. Here this is provided by placing the bias voltage source 18 in series with the circuit formed by the input, the tunnel diode and the resonant circuits and by providing an RF bypass capacitor 24 around the bias voltage source 18. Here the input is assumed to provide a DC path across the input leads 20. The bias voltage (E bias) must of course compensate for any DC voltage drops in the circuitry to the tunnel diode. However these are assumed to be insignificant here so that E bias is assumed to be fully applied across the tunnel diode 12.

Referring particularly to Fig. 2, the relationship between the bias voltage level, the tunnel diode resistance and exemplary input and output signals may be seen. The characteristic curve 26 of the tunnel diode 12 is shown with the bias levels and RF signals applied thereto. The input RF signal is identified by its period i/F. and the output RF signal by its period *n*/*m*Fo. It may be seen that the tunnel diode 12 is biased adjacent the inside edge of the negative resistance region 28 by E bias. This is a highly nonlinear resistance region, as may be seen from the rapid change in slope for excursions from the E bias point. The bias voltage may alternatively be set adjacent the opposite edge of the negative resistance region 28, as indicated by the E′ bias point as shown.

The bias point of the tunnel diode may be slightly within the negative resistance region 28, but only to the extent of cancelling out (and not exceeding) positive impedances in the circuit 10. The bias point must be such that the tunnel diode will not provide sufficient negative resistance to create or sustain circuit oscillations at the bias level. Yet the bias must be sufficiently adjacent the negative resistance region that part of the input signal riding on the bias level will extend substantially into the negative resistance region and that both harmonics selected by the two resonant circuits will thereby be amplified, sustained and beat together to reproduce the input signal. Accordingly the circuit provides an output signal only when the input signal is applied, and the output signal is locked to the input signal.

The circuit 10 also provides amplitude threshold. Only an input signal exceeding an amplitude level determined by the bias level will initiate output signals, i.e. there are no output signals from input signals or noise below the threshold. The tunnel diode may be biased further into its positive resistance region to raise the threshold.

The selected harmonic signals sustained by the resonant circuits 14 and 16 are fed back to the tunnel diode 12 and reamplified in each half cycle which extends into the negative resistance region. Accordingly the selected harmonic signals increase their excursions into the negative resistance region of the tunnel diodes until an equilibrium condition is reached. Equilibrium is achieved when the excursions extend into a portion of the tunnel diode characteristic curve where their further amplification is balanced by circuit resistances. Accordingly the output signal voltage level E out is quite constant over a wide range of input signal voltage levels (5/1or greater). Further, it may be seen that the magnitude of the output signal can substantially exceed the width of the negative resistance region since only one half cycle or less must extend into the negative resistance region.

As shown by FIG. 4, more than one output frequency may be provided by adding additional resonant circuits in series with the first and second resonant circuits 14 and 16. That is, the second resonant circuit 16 may comprise a connected series of separate resonant circuits simultaneously providing a series of different output frequencies. Each added resonant circuit, as the circuit 40 in FIG. 4, provides an additional distinct selected harmonic of the input frequency at a separate output across each added resonant circuit. The operation of the frequency transforming circuit is otherwise the same as the circuit 10 of FIG. 1. The sum of the resonant frequencies of all of resonant circuits, plus or minus, is set to equal the input frequency in the same manner as for the two resonant circuits of the circuit 10. The resonant circuit 40 of FIG. 4 provides an additional output frequency across the terminals A and B, which in FIG. 1 are directly connected.

Considering the circuit 30 shown in FIG. 3, its construction is essentially the same as that of the circuit 10 of FIG. 1 and the same electrical characteristics shown in FIG. 2 and described herein equally apply. The distinction is that there is only one resonant circuit 32, corresponding to the resonant circuit 16, and no corresponding first resonant circuit 14. The circuit 30 is suitable for a limited class of frequency transformations where the desired output frequency is a harmonic of the input frequency, (Fo/*n*) and in particular where the output frequency is to be one-half of the input frequency. However the circuit 30 is not as desirable as the circuit 10, particularly for output frequencies other than one-half the input frequency. In the circuit 30 the resonant frequency of the resonant circuit 32 added to itself equals the input frequency.

It may be seen that there has been described herein a novel and improved frequency transforming circuit. While the circuit described herein is presently considered to be preferred it is contemplated that further modifications and additions can be made by those skilled in the art. The following claims are intended to cover all such modifications and additions falling within the true spirit and scope of the invention.

What I claim is:

1. A frequency divider comprising:

two-terminal semiconductor means having a nonlinear impedance and positive and negative resistance operating regions;

a plurality of resonant circuits connected in series with the sum or difference of the resonant frequencies of at least two of said resonant circuits equal to the frequency of said input signal;

input lead means for applying an input signal to said semiconductor means and to said resonant circuits for the generation of subharmonics of only said input signal by said nonlinear impedance of said semiconductor means;

said resonant circuits having resonant frequencies which are selected subharmonics of said input signal;

bias means biasing said semiconductor means and said resonant circuits to a single stable nonoscillating positive resistance operating point at which said selected subharmonics of said input signal extend substantially into said negative resistance operating region of said semiconductor means to amplify said selected subharmonics;

means connecting said resonant circuits to said semiconductor means to feed back only said selected subharmonics of said input signal to said semiconductor means for amplification;

and output lead means connecting with at least one of said resonant circuits for providing only said selected and amplified subharmonics of said input signal as an output signal.